United States Patent [19]
Meredith, Jr. et al.

[11] Patent Number: 6,128,087
[45] Date of Patent: *Oct. 3, 2000

[54] SYSTEM FOR EVALUATING THIN FILM COATINGS

[76] Inventors: William A. Meredith, Jr., 613 Fourth Ave. SW.; Charles C. Gammans, 430 NW. Seventh St., both of Faribault, Minn. 55021; Kelly R. Clayton, 17295 Jasmine, Lakeville, Minn. 55044; Erik J. Bjornard, 5590 Endwood Trail, Northfield, Minn. 55057; Kim D. Powers, 7890 - 170th St. West, Lakeville, Minn. 55944

[*] Notice: This patent is subject to a terminal disclaimer.

[21] Appl. No.: 09/074,843

[22] Filed: May 8, 1998

Related U.S. Application Data

[62] Division of application No. 08/541,201, Oct. 16, 1995, Pat. No. 5,772,861.

[51] Int. Cl.[7] ............................. G01B 11/06; C23C 14/54
[52] U.S. Cl. ............... 356/381; 204/298.03; 204/192.13; 118/665; 118/688; 118/696; 118/708; 118/712; 118/713; 427/9; 427/10
[58] Field of Search ..................................... 356/381, 382; 204/298.03, 192.13; 427/9, 10; 118/665, 668, 696, 698, 708, 712, 713

[56] References Cited

U.S. PATENT DOCUMENTS

| | | | |
|---|---|---|---|
| 4,311,725 | 1/1982 | Holland | 204/298.03 |
| 4,676,647 | 6/1987 | Kikkawa et al. | 356/382 |
| 4,936,964 | 6/1990 | Nakamura | 204/298.03 |
| 5,120,966 | 6/1992 | Kondo | 356/381 |
| 5,154,810 | 10/1992 | Kamerling et al. | 204/298.03 |
| 5,422,703 | 6/1995 | Horie et al. | 356/382 |
| 5,489,369 | 2/1996 | Bjornard et al. | 204/298.25 |
| 5,493,401 | 2/1996 | Horie et al. | 356/382 |
| 5,507,870 | 4/1996 | Siebert | 118/712 |
| 5,665,214 | 9/1997 | Iturralde | 356/369 |
| 5,772,861 | 6/1998 | Meredith, Jr. et al. | 204/298.03 |

*Primary Examiner*—Hoa Q. Pham
*Attorney, Agent, or Firm*—Dorsey & Whitney LLP

[57] ABSTRACT

A system for evaluating the reflectance of an object (e.g., a CRT) that is coated with an anti-reflective coating material is disclosed. The quality and/or uniformity of the coating is evaluated by a reflectometer. The reflectometer is positioned relative to the object by non-contact sensors. Reflectance data gathered by the reflectometer is analyzed to determine to what extent the actual coating differs from the optimal (i.e., ideal) coating. A feedback system modifies the coating process for subsequent objects in an attempt to fine-tune the coating process and achieve optimal anti-reflective coatings.

2 Claims, 17 Drawing Sheets

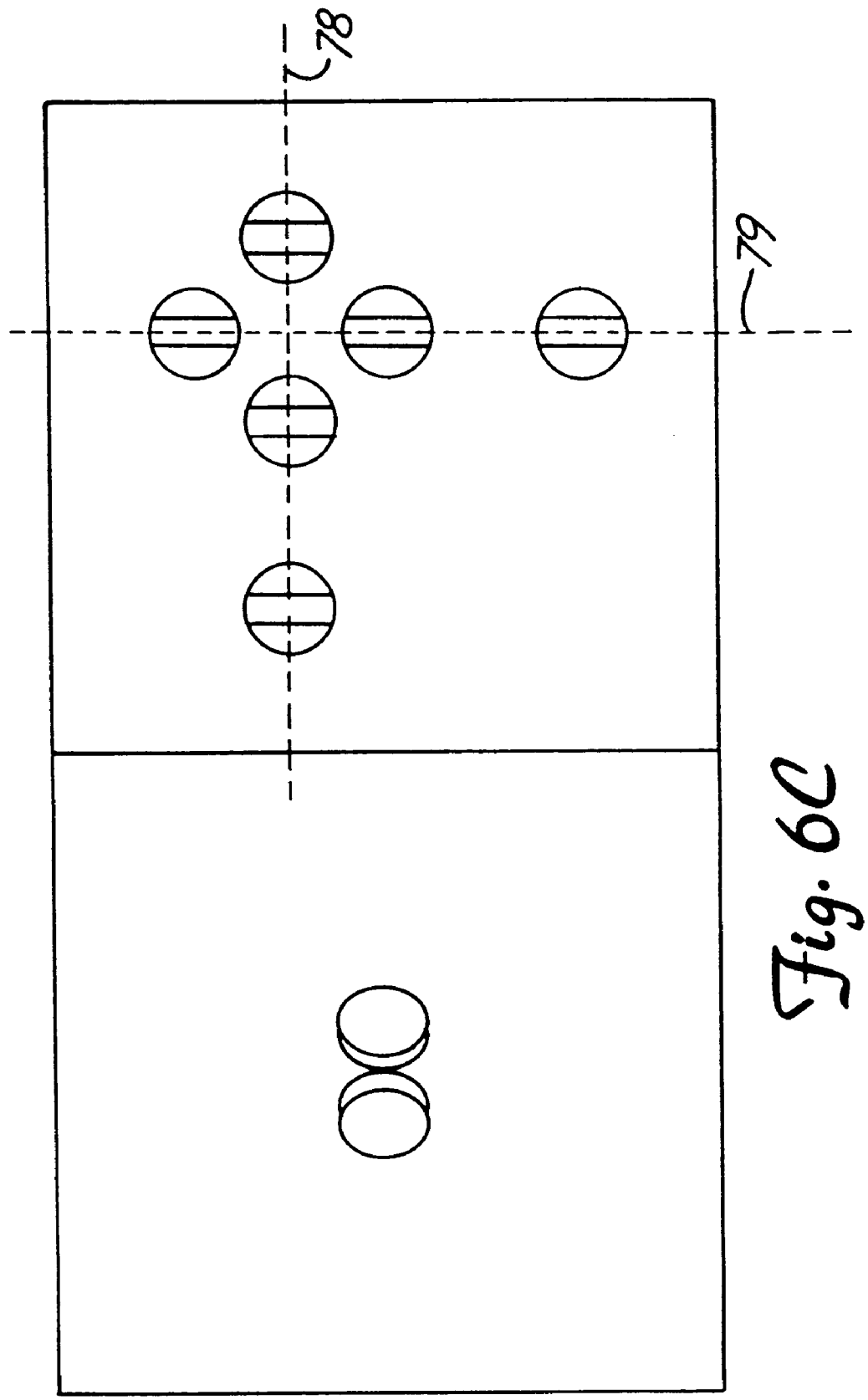

SYSTEM FOR EVALUATING THIN FILM COATINGS

This application is a divisional application of application Ser. No. 08/541,201, filed Oct. 16, 1995, and issued as U.S. Pat. No. 5,772,861 on Jun. 30, 1998, which is incorporated herein by reference.

FIELD OF THE INVENTION

The present invention relates to a system that is used to evaluate and improve the quality or uniformity of a thin film coating on an object. In one embodiment, the present invention is capable of evaluating the quality of a coating without disrupting it. In another embodiment, the present invention is also capable of adjusting the manner in which the thin film coating is applied to subsequent objects based on the evaluation of the coating.

BACKGROUND OF THE INVENTION

On common objective of designers and manufacturers of displays using cathode ray tubes (CRTs) is to reduce glare resulting from the reflection of ambient light off of the CRT face. Several approaches have been used to reduce such glare. In one approach, the surface of a CRT screen is treated by chemical etching such as by means of a hydrofluoric acid solution. In another approach, an anti-glare filter is used that consists of a piece of glass or other material having an anti-reflective view surface. In this approach, the filter is placed in a frame and suspended in front of the CRT view surface.

The preferred approach, however, is to apply optical interference coatings directly to a CRT screen. This can be done through a variety of thin film deposition techniques such as electron beam deposition, chemical vapor deposition, among others. One reason direction application of optical interference coatings is preferred is that is possible for the anti-reflective coating to be electrically conductive. Electrical conductivity facilitates the dissipation of static electrical charges and thereby reduces accumulation of dust on the CRT. Electrically conductive coatings, when effectively grounded, also substantially reduce the ELf/VLF field emissions from the CRT.

One the optical interference coating is applied, it is desirable to evaluate the uniformity or quality of the coating. However, the coating is usually elevated in temperature, so any object coming in contact with the coating before the coating has cooled will disrupt the coating. For example, if contact with the coating is made by an organize compound (e.g., plastic), the compound will leave undesirable reside on the coating. If contact is made by a metallic object, the object may scratch the coating. Thus, in the past, it has been necessary to wait until the coating completely settles and/or cools before it is tested. This delay complicates the manufacturing process, and therefore increases the cost of coating the CRT displays. Accordingly, there exists a need for a system or method for evaluating the quality of a thin film coating soon after the coating is applied to a CRT display.

In addition, experience has shown that when a number of CRTs are coated in succession (e.g., in an assembly line), the thickness or uniformity of the layers applied to each CRT tends to vary among CRTs. Because the quality of the anti-reflective coating depends on the thickness of the layers of material, this variance diminishes the quality of the anti-reflective coating. Accordingly, there exists a need not only to evaluate the coating applied to CRTs to determine whether quality is diminishing, but also to maintain a consistent high-quality anti-reflective coating.

These and other deficiencies in the art that are addresses by the present invention will become apparent upon reading the following detailed description in the context of the associated drawings.

SUMMARY OF THE INVENTION

In one embodiment, the present invention relates to a system for evaluating reflectance that comprises: (a) coating means for coating a surface of an object with a coating material, wherein the coating material has a composition comprising one or more layers, (b) a light source; (c) a reflectometer that directs an incident light beam from the light source at the surface of the object, and that also captures a reflected light beam, wherein the reflected light beam is the incident light beam after it is reflected off of the surface of the object; (d) a light splitting apparatus for splitting the reflected beam into a plurality of constituent beams, each of the constituent beams being representative of a given wavelength; (e) an array of light sensors positioned so that each of the constituent beams is aligned with one of the light sensors, wherein each of the light sensors generates current that varies with the intensity of light incident upon it (f) an interface, wherein the interface converts the current from the light sensors into a code that represents the intensity of the light for each of the constituent beams; and (g) means for analyzing the code from the interface along with information about the composition of the coating material to determine an actual layer thickness value for each of the layers of coating material.

The system may further comprise (h) means for comparing each of the actual layer thickness values to an optimal layer thickness value, wherein the optimal layer thickness value is based on a predetermined design of the coating material, and (i) controller means for adjusting how much of each layer of the coating material is applied by the coating means to a subsequently coated object, wherein the controller means makes adjustments based on the comparison of the actual layer thickness value and the optimal layer thickness value.

The present invention also relates to a method of positioning an apparatus relative to a target line that extends at a known angle from a plane tangent to a reference point on an object. In one embodiment, the method involves: determining the orientation, relative to the plane tangent to the point on the object, of an initial position line that extends from the apparatus through the reference point; calculating a rotation angle, wherein the rotation angle is the angle between the target line and the initial position line; and rotating the apparatus by the rotation angle.

The apparatus mentioned in the method described above may comprise: a reflectometer; a non-contact sensor; and positioning means for moving the reflectometer and the non-contact sensor.

Other embodiments and features of the present invention will become apparent upon reading the following detailed description in the context of the associated drawings.

It is an object of the present invention to provide a non-contact method of positioning a reflectometer.

It is an object of the present invention to provide a method of positioning a reflectometer normal to the surface of an object.

It is a further object of the present invention to provide a method of evaluating the reflectance of an object.

It is a further object of the present invention to provide a method of evaluating the reflectance of an object soon after optical interference coatings are applied to the object.

It is a further object of the present invention to provide a method and system for consistently applying high-quality optical interference coatings.

It is a further object of the present invention to provide a method and system for applying progressively higher quality optical interference coatings.

BRIEF DESCRIPTION OF THE DRAWINGS

FIG. 6c is a view of an alternative embodiment of the reflectometer/sensor combination viewed along cross-section 6b—6b.

DETAILED DESCRIPTION

Figure 1:
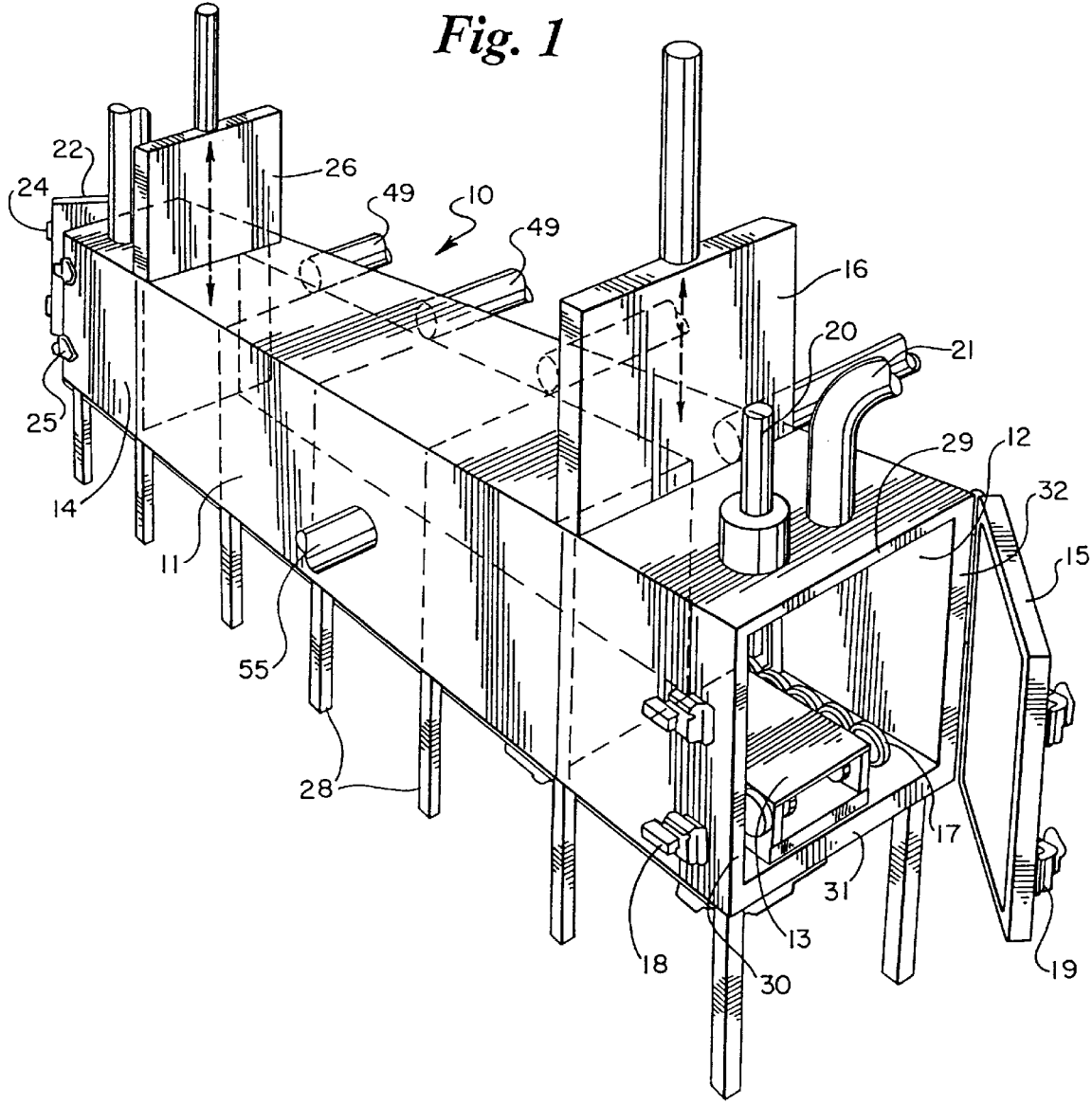
FIG. 1 is a perspective view of an apparatus having a centrally located process chamber.

The present invention relates to a system for evaluating and improving the quality of an anti-reflective thin film coating that has been applied to the front face of the CRT display. The present invention is particularly applicable to system that applies to a thin film coating in the manner described in commonly-assigned copending application Ser. No. 08/142,638, now U.S. Pat. No. 5,489,369 the entire specification of which is hereby incorporated by reference. In that application, a coating means or apparatus 10 is described which includes an elongated housing with a centrally located process camber 11 and end sections comprising entry and exit buffer chambers 12 and 14, respectively. See FIG. 1. Both chamber 12 and 14 function as buffer zones or chambers to facilitate entry of an article to be coated, or exit of the coated article from the process chamber 11.

Figure 2:
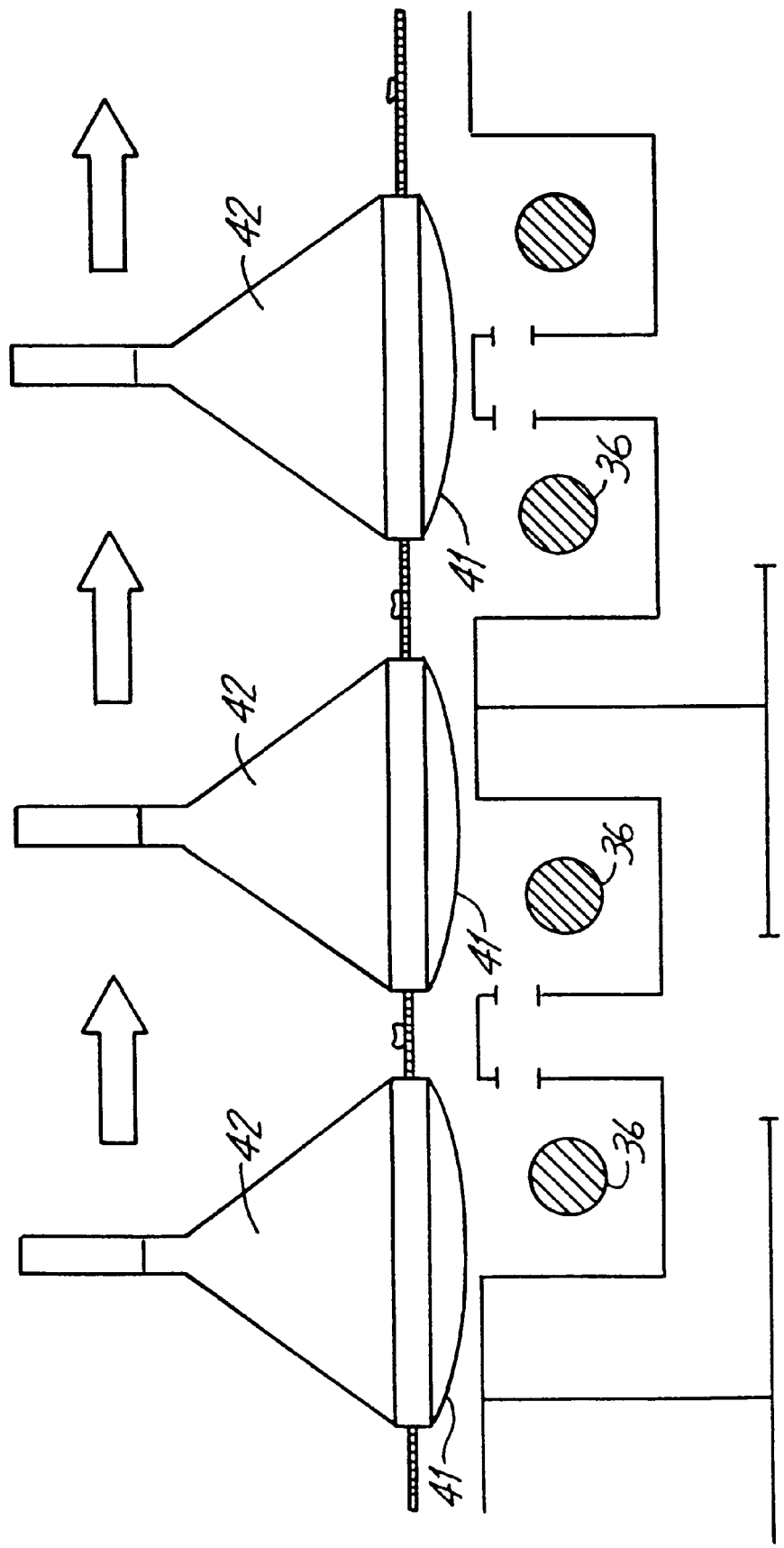
FIG. 2 is a top schematic illustration of the process chamber showing a plurality of coating devices and a plurality of CRTs being moved through the process chamber.

The interior of one embodiment of the process chamber 11 is illustrated schematically in FIG. 2. A plurality of thin film deposition devices are used for depositing the thin film coating on the face of the CRTs 42. In the embodiment shown, the thin film deposition devices are sputtering cathodes 36. The cathodes 36 are rotatable which are constructed of a target material and function in accordance with technology known in the art. During operation, each of the cathodes 36 emit atoms or other small particles for deposition onto the face 41 or a CRT (or other article to be coated).

Each of the CRTs 42 are moved along a path (indicated by the arrows in FIG. 2) to facilitate a contiguous coating process. Within the chamber 11, the CRTs 42 are progressively moved past the various sputtering cathodes 36 for sequential deposition of a thin film coating. By the time the CRTs 42 pass through the chamber 11, they are coated with various layers of deposition material.

Figure 3:
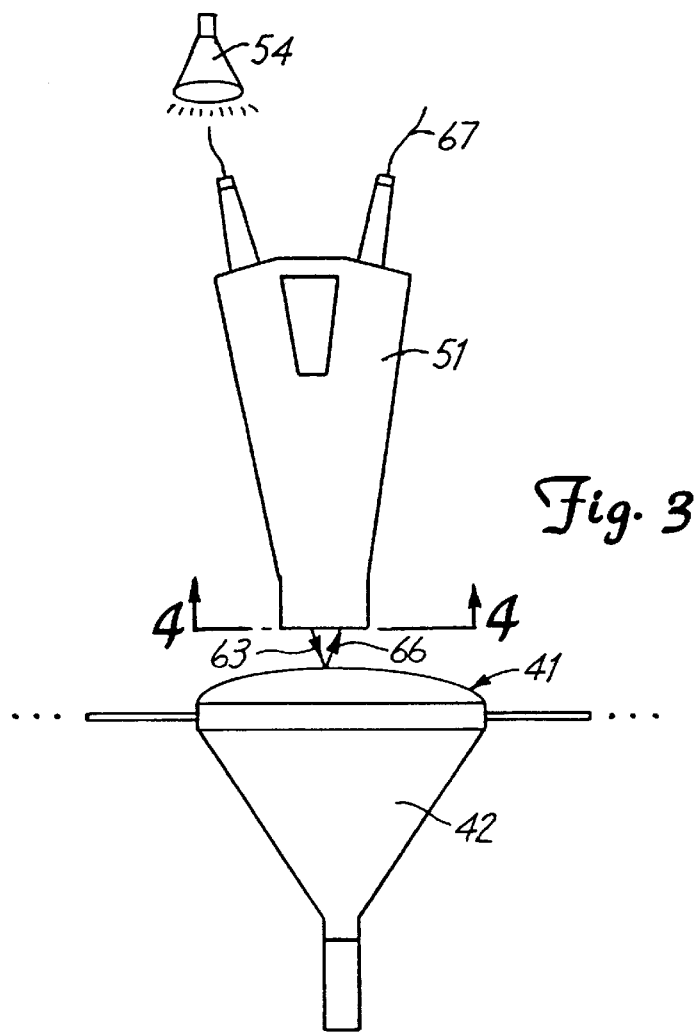
FIG. 3 is a top schematic illustration of a reflectometer positioned in front of a CRT.

After emerging from the chamber 11, the reflectance properties of the coated CRT face 41 are then evaluated by the reflectometer 51 shown in FIG. 3. The reflectometer 51 generates an incident light beam 63 from a light source 54. This incident light beam 63 is reflected off of the face 41 of the CRT 42. The reflected light beam 66 is directed back to the reflectometer 51 as shown in FIG. 3. The reflectometer 51 generates an incident light beam 63 from a light source 54. This incident light beam 63 is reflected off of the face 41 of the CRT 42. The reflected beam 66 is then passed through the reflectometer 51 as shown. The reflected beam 66 is then passed through the reflectometer 51 and sent out connection 67 for evaluation.

Figure 4:
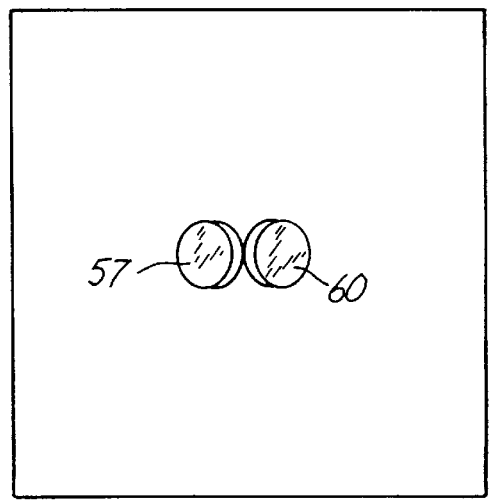
FIG. 4 is a view of the reflectometer viewed along cross-section 4—4.

FIG. 4 shows the underside of the reflectometer viewed at section 4—4 in FIG. 3. The incident light beam 63 in FIG. 3 is directed through opening 57. The light beam 66 reflected off of the face 41 of the CRT 42 in FIG. 3 is captured by the opening 60.

Figure 5A:
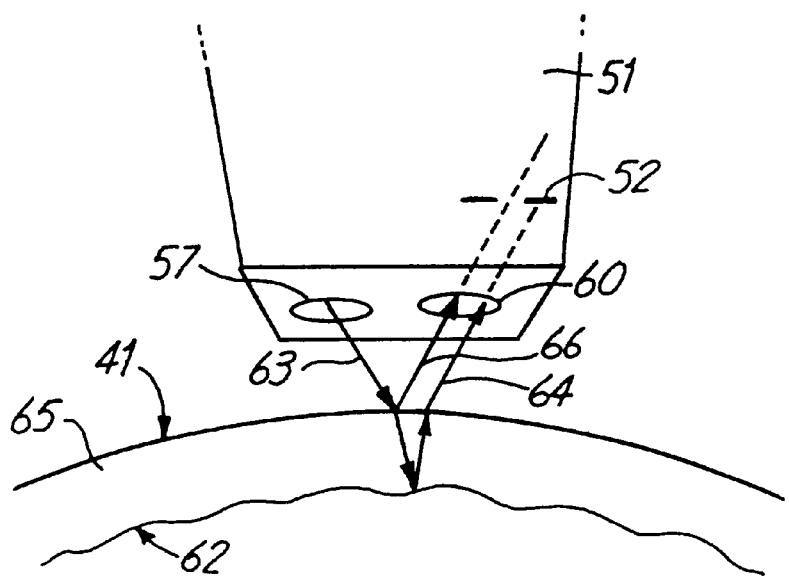
FIGS. 5a to 5d are views of the reflectometer at various positions in front of a CRT.

The reflectometer 51 also has a slit filter 52 that captures the light reflected off the CRT surface and filters out stray light from other sources. See FIG. 5a. Only the light that passes through the slit filter 52 is evaluated as hereinafter described. However, in order for the slit filter 52 to capture only the light reflected off of the CRT face 41, the reflectometer 51 has to be positioned a known distance from the surface 41 of the CRT 42, and at a known orientation (e.g., perpendicularity the line tangent to the surface of the CRT.) FIG. 5a illustrates (in one embodiment) the proper reflectometer orientation and positioning relative to the face 41 of the CRT 42. An incident light beam 63 is directed through the opening 57 where it is reflected off of the face 41 of the CRT 42. The light beam 66 reflected off of the surface of the CRT face 41 is captured by the opening 60. A second reflected beam 64 is reflected off of the back surface 62 of the CRT glass 65. When the reflectometer 51 is oriented properly, as in FIG. 5a, both reflected light beams 66 and 64 are captured by the lens 60, but the light beam 64 is filtered only by the slit filter 52. The filtering ensures that only the light beam reflected directly off of the coated surface 41 of the CRT 42 is evaluated.

Figure 5B:
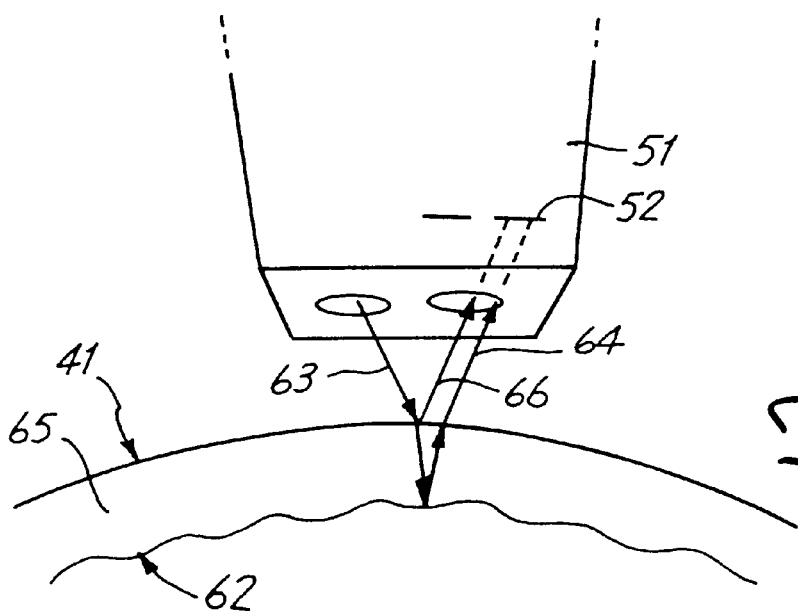
Figure 5C:
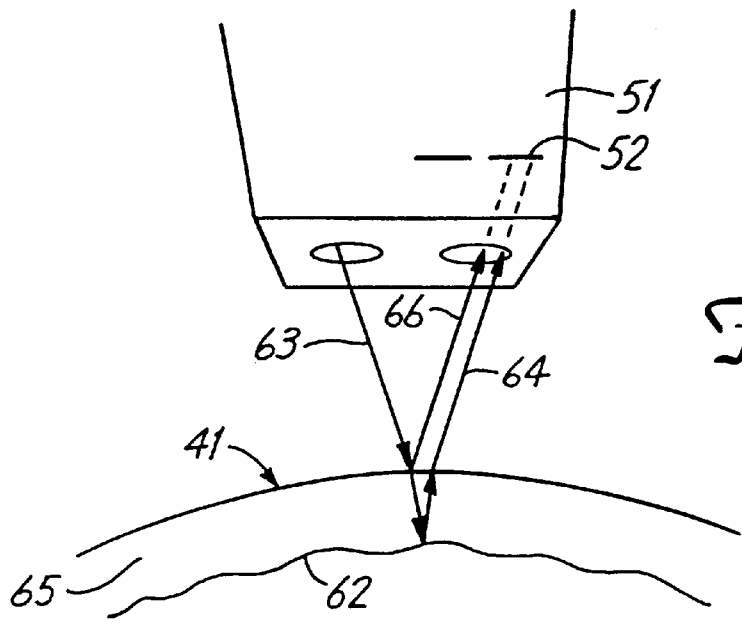

When the reflectometer 51 is not oriented properly, the beam 66 may be filtered out by the slit filter 52, thereby preventing an accurate evaluation of the anti-reflectance properties of the CRT face 41. For example, FIG. 5b shows the effect that a non-perpendicular orientation may have on the ability of the slit filter 52 to capture the reflected beam 66. The beam 66 in FIG. 5b is captured by the opening 60, but it is filtered out by the slit filter 52. FIG. 5c shows a similar effect when the reflectometer 51 is oriented perpendicular to the face 41 of the CRT 42, but too far away from the face 41. The beam 66 in FIG. 5c also is filtered out by the slit filter 52.

Figure 5D:
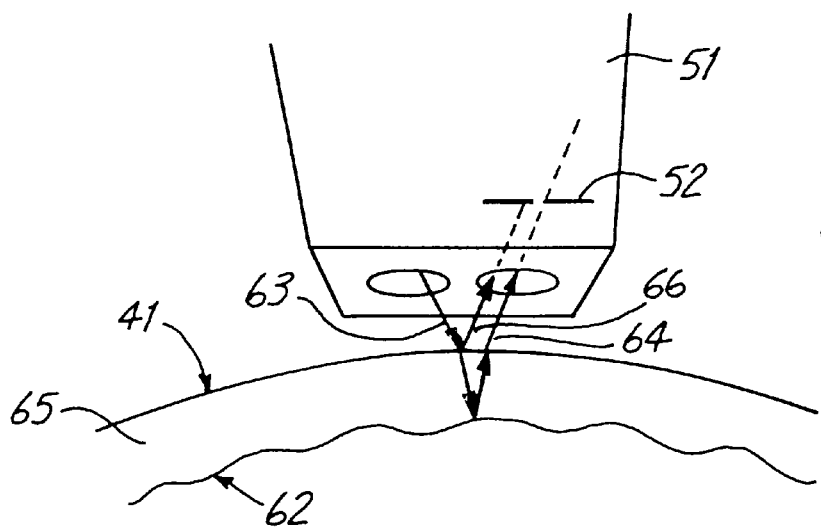

When the reflectometer 51 is too close to the surface of the CRT face 61, the beam 64 reflected off of the back surface 62 of the CRT glass 65 may pass through the slit filter 52 while the beam 66 that is reflected off of the surface 41 may be filtered out by the slit filter 52. See FIG. 5d. Thus, when the reflectometer 51 is too close to the surface 41 of the CRT 42, the wrong light beam can be captured by the slit filter 52. Although the proper positioning has been describe above as requiring a perpendicular orientation, the proper positioning will depend on the structure of the reflectometer used.

The foregoing examples demonstrate the importance of proper positioning and orientation of the reflectometer 51 relative to the face 41 of the CRT 42. However, the process of positioning the reflectometer 51 should be done without the reflectometer coming in contact with the CRT face 41 because the coating on the face 61 is prone to damage or disruption for a significant period of time after it is applied. Thus, to avoid disrupting the coating, a non-contact method of positioning the reflectometer 51 is employed. The present invention employs one or more non-contact sensors to gauge the orientation and position of the reflectometer 51 when the reflectometer 51 is being positioned relative to the CRT. The position of the reflectometer relative to the surface 41 of the CRT 42 is determined by these non-contact sensors. Using this information, a robotic arm can be used to position the combination of the sensors and the reflectometer 51 in an appropriate position so that the quality of the coating can be effectively evaluated by the reflectometer.

Although optical sensors could possibly be used as the non-contact sensors, optical sensors typically do not work well because their operation depend on reliably receiving a reflected beam of light from an object. Because an incident light beam will generate at least two reflected light beams off of a CRT (i.e., one off the face 41 and another off of the reverse side 62 of the glass 65), an optical sensor may provide an inaccurate reading. Dealing with this condition is particularly difficult because the two reflected light beams 63 and 64 are not necessarily parallel. Unlike the surface 41, the back surface 62 of the CRT glass 65 is not typically smooth. See FIG. 5a to 5d.

In the preferred embodiment of the present invention, acoustic or ultrasonic sensors are used as the non-contact sensors. These types of sensors are not as susceptible to the problems generated by reflections off of the back surface 62 of the CRT glass 65. For at least this reason, they are preferred over optical sensors.

Figure 6A:
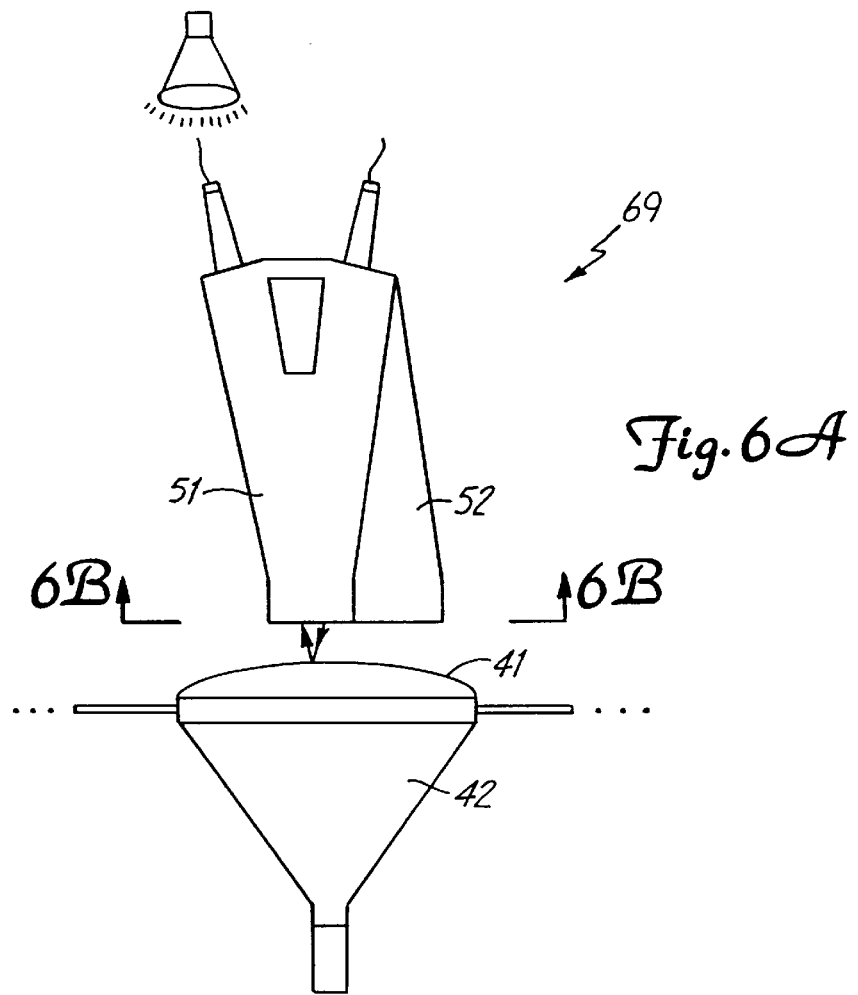
FIG. 6a is a top schematic illustration of a reflectometer/sensor combination positioned in front of a CRT.
Figure 6B:
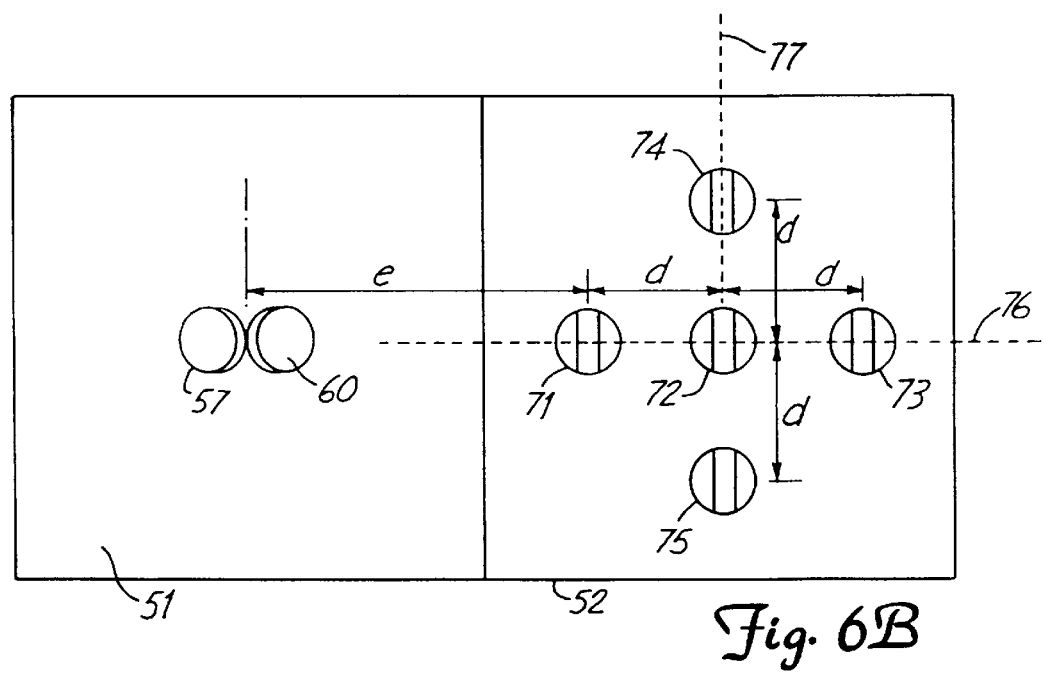
FIG. 6b is a view of the reflectometer/sensor combination viewed along cross-section 6b—6b.

FIGS. 6a and 6b show a reflectometer 51 and a sensor head 52. The sensor head 52 is used for positioning the reflectometer relative to the CRT face 41. (The reflectometer 51, the sensor head 52, and the CRT 42 are not necessarily drawn to scale.) As shown in FIG. 6b, the underside of the sensor head 52 has five ultrasonic sensors 71–75 that are used to gauge the position of the reflectometer 51. Together, the reflectometer 51 and sensor 52 constitute a reflectometer/sensor combination 69.

In order for the reflectometer to operate effectively in the embodiment of FIGS. 5a to 5b, it must be aligned along a line normal to the surface of the CRT 42. (More generally, the reflectometer only has to be positioned at a known angle relative to the normal line; the actual angle would depend on the structure of the reflectometer.) The manner in which these five sensors are used to align the reflectometer 51 along a line normal to the surface of the CRT face is illustrated in FIGS. 7a to 7e. The first step is to determine the three-dimensional orientations of the initial position of the reflectometer 51. The position of the reflectometer 51 in three dimensions is determined by calculating the two-dimensional position of the combination 69 using sensors 74, 72, and 75. The sensors 71–75 are, in the embodiment shown in FIG. 6b, positioned in a star configuration so that the sensors are capable of making three distance measurements in each of two planes. In FIG. 6b, these planes are perpendicular to the plane of the paper, where one plane lies along line 77, and the other lies along line 76. Plane 76 is the plane of the paper in FIGS. 7a and 7b. Sensor 72 thus lies in both planes.

In another embodiment, six sensors could be used in the configuration shown in FIG. 6c, in which three sensors are disposed in a first plane 78 (perpendicular to the paper) and three sensors are disposed in a second plane 79 (also perpendicular to the paper). In this embodiment, the three-dimensional position of the reflectometer 51 is determined by finding the two-dimensional position of the combination 69 using the sensors in plane 78, and then by doing the same with the sensors in plane 79.

Figure 7A:
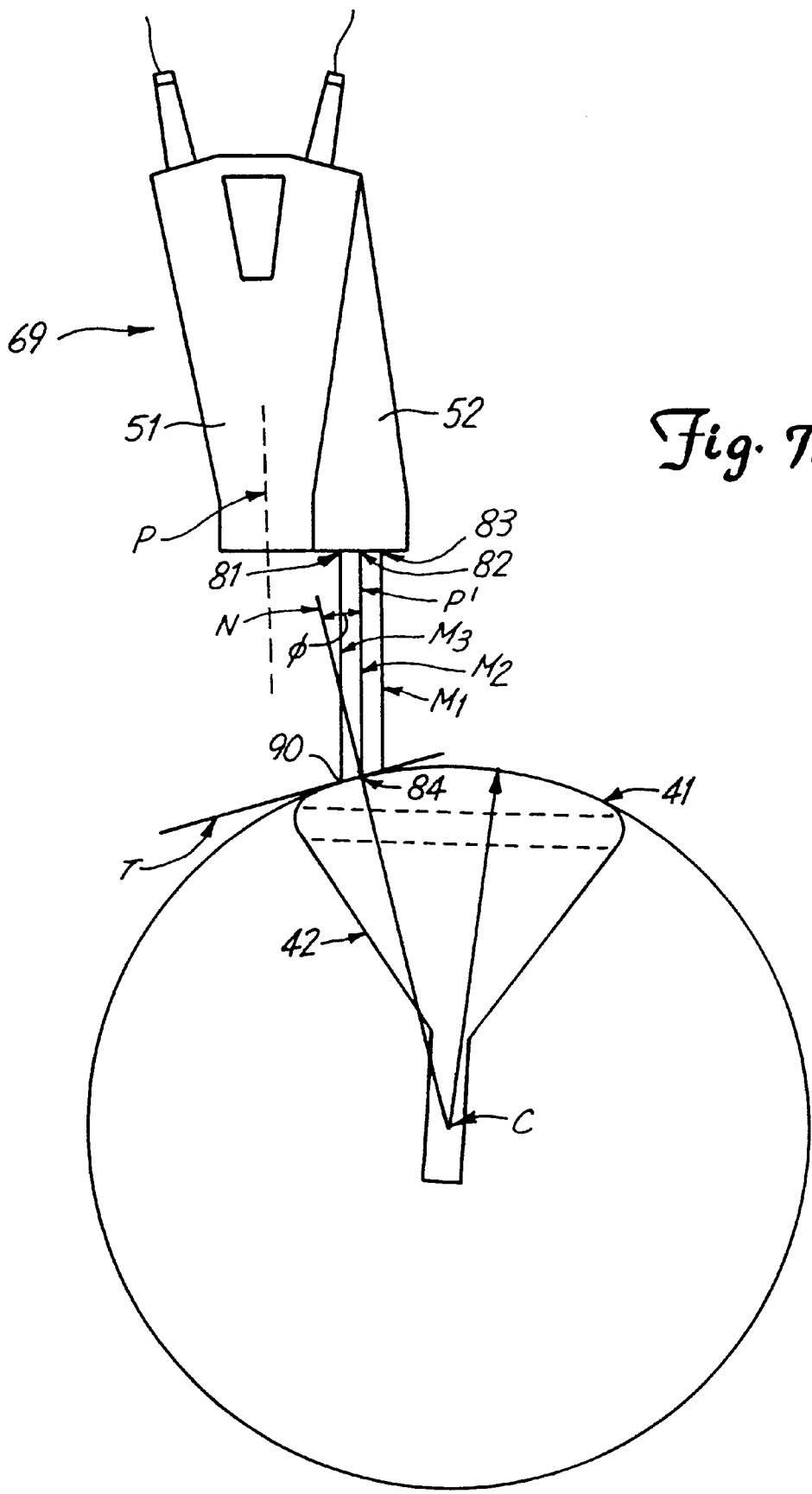
FIGS. 7a to 7c are top schematic illustrations of how sensors can be used to position a reflectometer along a line normal to a point on a CRT.
Figure 7B:
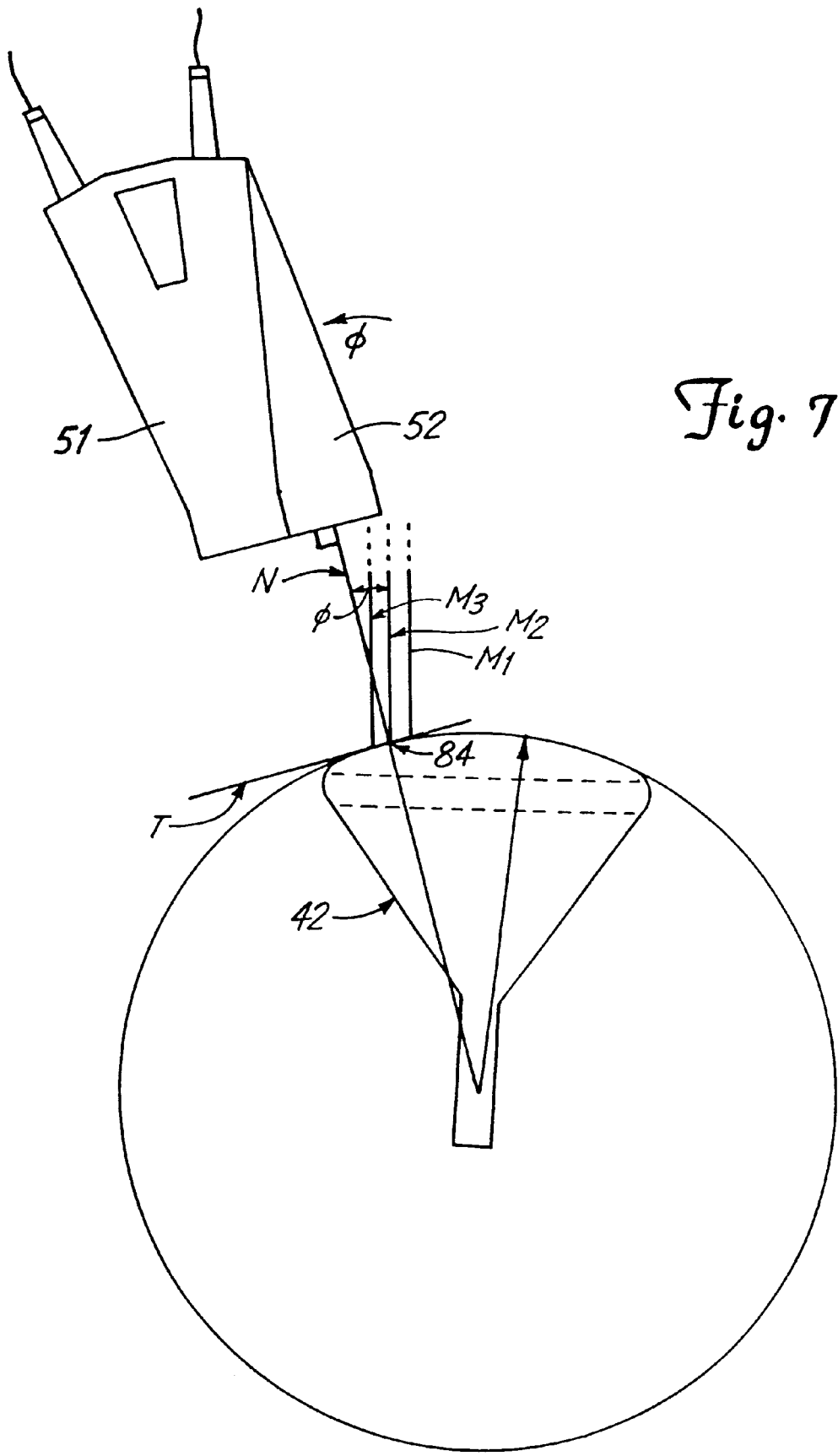

FIG. 7a represents a two-dimensional view of the CRT 42. The face 41 of the CRT 42 is spherical in FIG. 7a, but the face could be flat, concave, or even aspherical. A robotic arm (not shown in FIG. 7a) is used to position the combination 69. In the preferred embodiment, the robotic arm is capable of accurately rotating about a point in space.

The desired reflectometer position is in an orientation that is normal to the surface of the CRT 42 along target line N. In the embodiment shown, the target line N is perpendicular to the line T, which is tangent to the circle C. The orientation of the initial reflectometer position is shown as initial position line P'. Line P' is parallel to line P. (For purposes of illustration, the target line N is assumed in FIGS. 7a to 7e to be perpendicular to the line T. But in other embodiments, the line N need not be perpendicular to the line T if the reflectometer 51 will capture the reflected light beam when it is positioned at a non-perpendicular angle.)

To determine the angle between the initial orientation of the reflectometer 51 (represented by line P) and the desired orientation (represented by target line N), the sensors 71, 72, and 73 at position 81, 82, and 83, respectively, take three measurements in the plane of the paper. The three sensors thus measure the distance (M3, m2, and m1) from the sensor head 52 to three points on the surface of the CRT (90, 84, and 93) through which a circle can be drawn, the center of which is at C. Therefore, determining the position of the line N involves fitting a circle to three points (90, 84, and 93) and identifying (i.e., calculating) the line normal to the circle through the point 84 (i.e., normal to the tangent line T). Point 84 is taken as a reference point. From this information, the angle φ between the line N and the line P (or line P') can also be determined.

A similar procedure is then carried out in a second plane defined by the sensors 74, 72, 16 and 75 in FIG. 6b. This plane is oriented at a known (non-zero) angle relative to the first plane (the first plane being the plane of the paper) because sensors 74, 72, and 75 are arranged in a line whose angle with respect to the line defined by the sensors 71, 72, and 73 is known. Typically, the two planes are perpendicular to each other, but this condition is not required as long as the angle is known. The calculations done in both planes enable a determination of the proper three-dimensional position of the reflectometer 51. Generally, the foregoing procedure for positioning the reflectometer will be most effective when the surface 41 of the CRT 42 has a radius of curvature that is approximately constant near the location of the points 90, 84, and 93. However, it is not necessary that the radius of curvature be centrally located, or that the surface 41 be spherical over the entire face of the CRT.

Figure 7C:
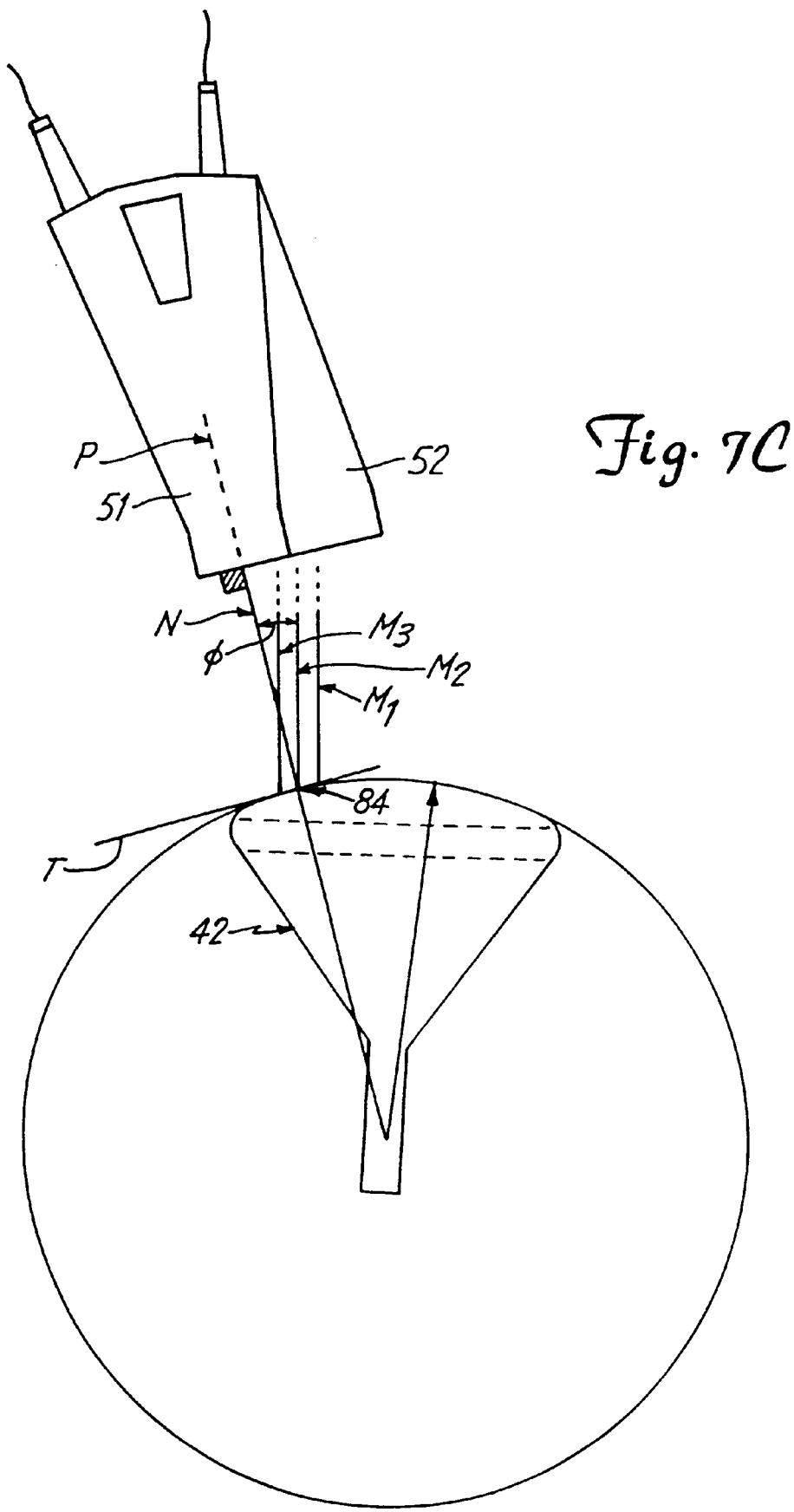

After the three-dimensional orientation of the combination 69 is known, the next step in positioning the reflectometer 51 is to rotate the combination of 69 by the angle φ about the reference point 84. The combination is also rotated about the angle φ in the second plane. This is done either simultaneously with the rotation in the first plane, or the rotations can be done sequentially. Thereafter, the sensor head 52 will be oriented along the line N. See FIG. 7b. Then, the combination 69 is moved in a direction generally perpendicular to the line N. This is done so that reflectometer 51 (and not the sensor head 52) is aligned along the line N. The result is shown in FIG. 7c. The distance from the surface of the CRT to the reflectometer 51 is thereafter adjusted by moving the reflectometer along line N in a manner that maintains its orientation relative to the tangent line T.

In another embodiment, the order of the second and third steps can be changed so that, for example, the reflectometer 51 is moved laterally (while maintaining its orientation relative to the tangent line T) before it is rotated by the angle φ. After the lateral movement, rotating the reflectometer 51 by the angle φ will align the reflectometer 51 along the line N in the manner shown in FIG. 7c.

Figure 7D:
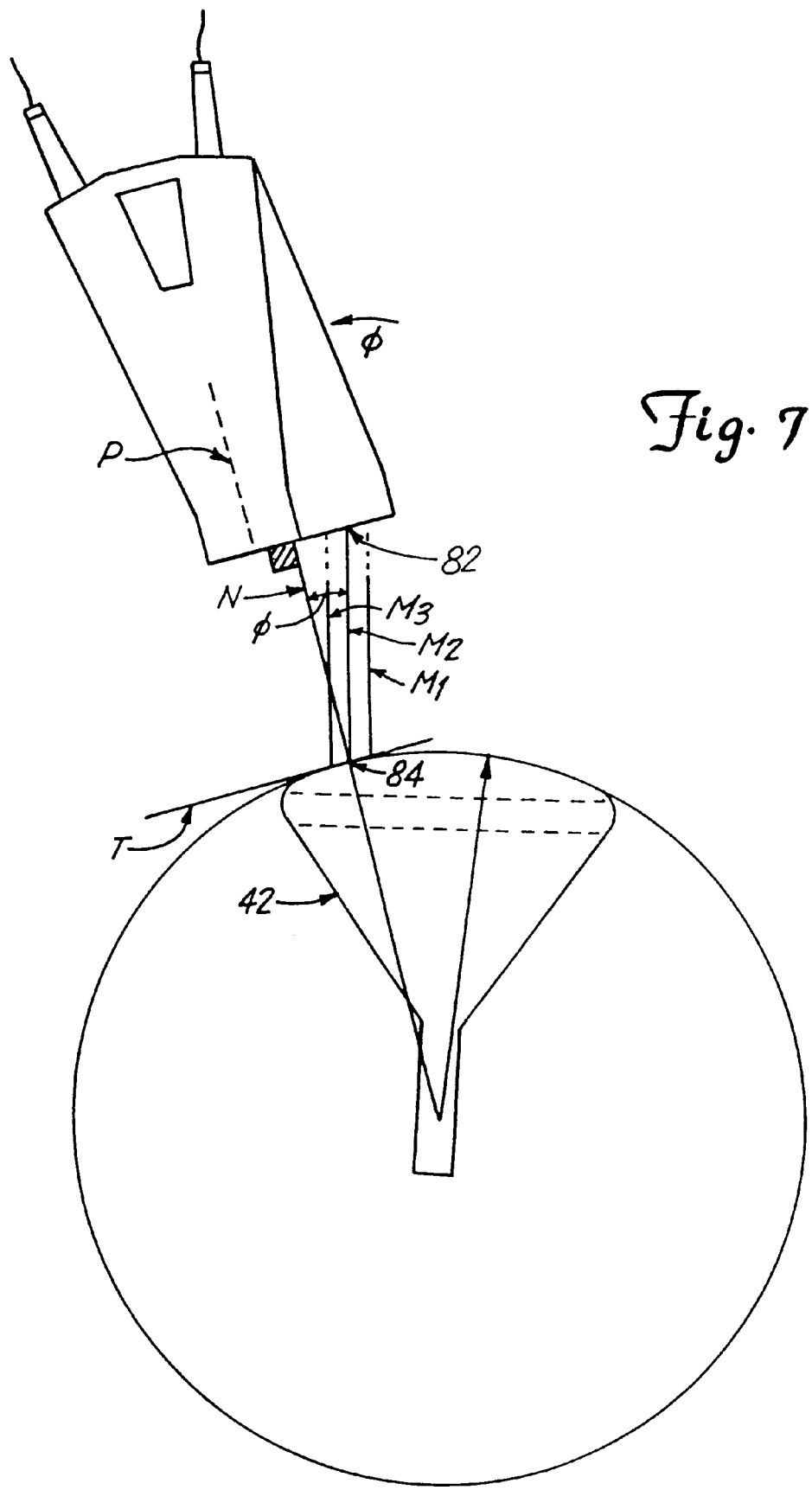
FIGS. 7d and 7e are top schematic illustrations of how sensors can be used in an alternate embodiment to position a reflectometer along a line normal to a point on a CRT.
Figure 7E:
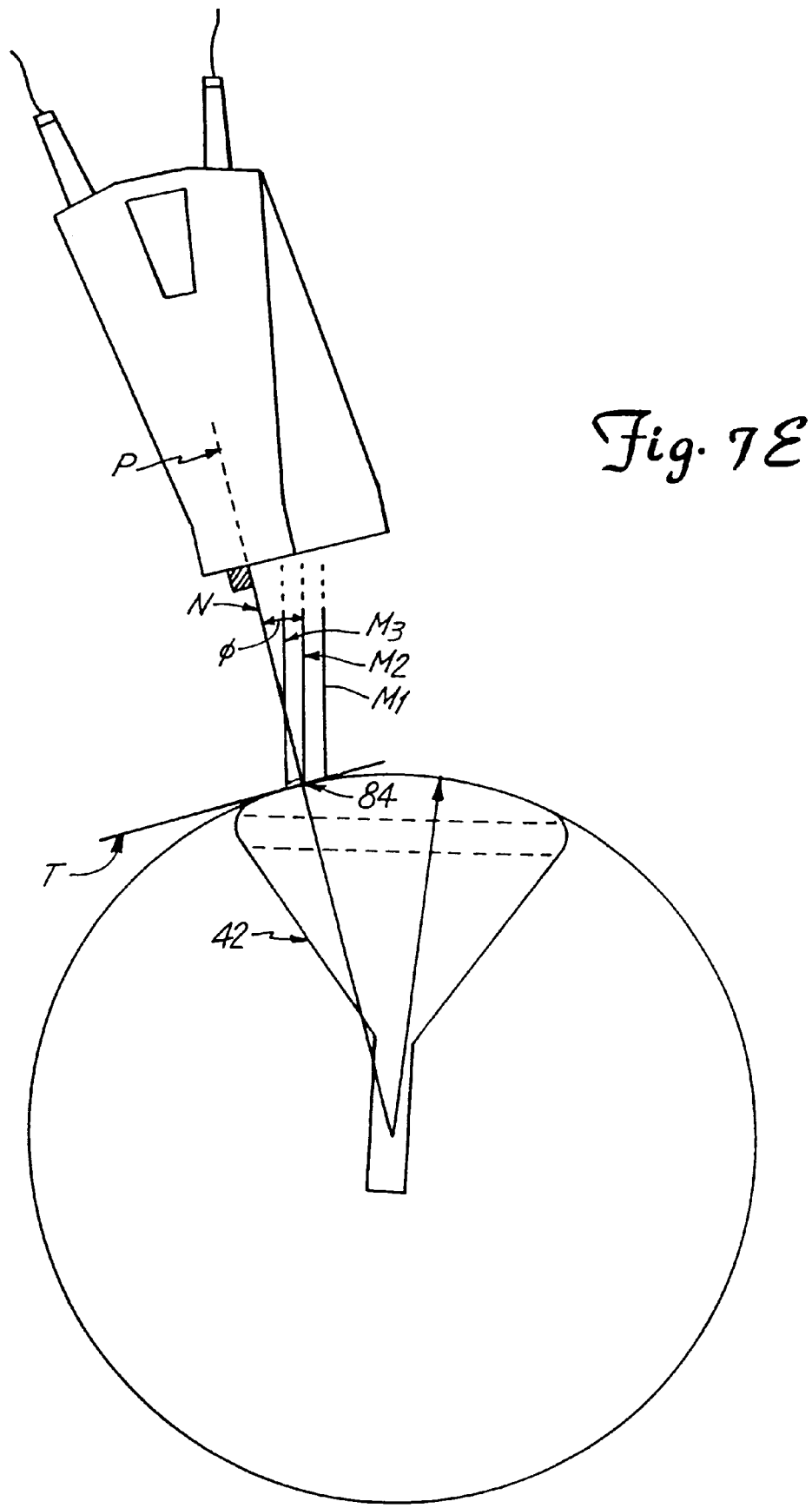

In yet another embodiment, the second step could involve rotating the combination 69 about the point 82 by the angle φ, so that the combination is as shown in FIG. 7d. The third step in this embodiment would be to move the combination 69 laterally (while maintaining its orientation with respect to tangent line T) so that it is aligned along line N, as shown in FIG. 7e.

Finally, in another embodiment, the movements described above can be combined so that the combination 69 is moved into the proper position with one three-dimensional motion. The steps described above need to be carried out separately. The foregoing embodiments are merely illustrative, however, and other movement sequences that would occur to one skilled in the art are possible.

The combination 69 can be implemented with fewer than five sensors, perhaps even a single sensor. In a single sensor embodiment, the combination 69 is moved by a robotic arm (or other means) in order to take a sufficient amount of sensor measurements to determine the orientation of the reflectometer head relative to the vector normal to the surface of the CRT. In this manner, the robotic arm could move a single sensor to five points that are arranged so as to produce the star configuration of sensors shown in FIG. 6b. Alternatively, the sensor could be moved in a manner that will emulate the sensor configuration of FIG. 6c. Although a combination having a single sensor is sufficient, a combination with five (or six) sensors is faster and more efficient, and potentially more accurate. However, the cost increases with the number of sensors used.

Figure 8:
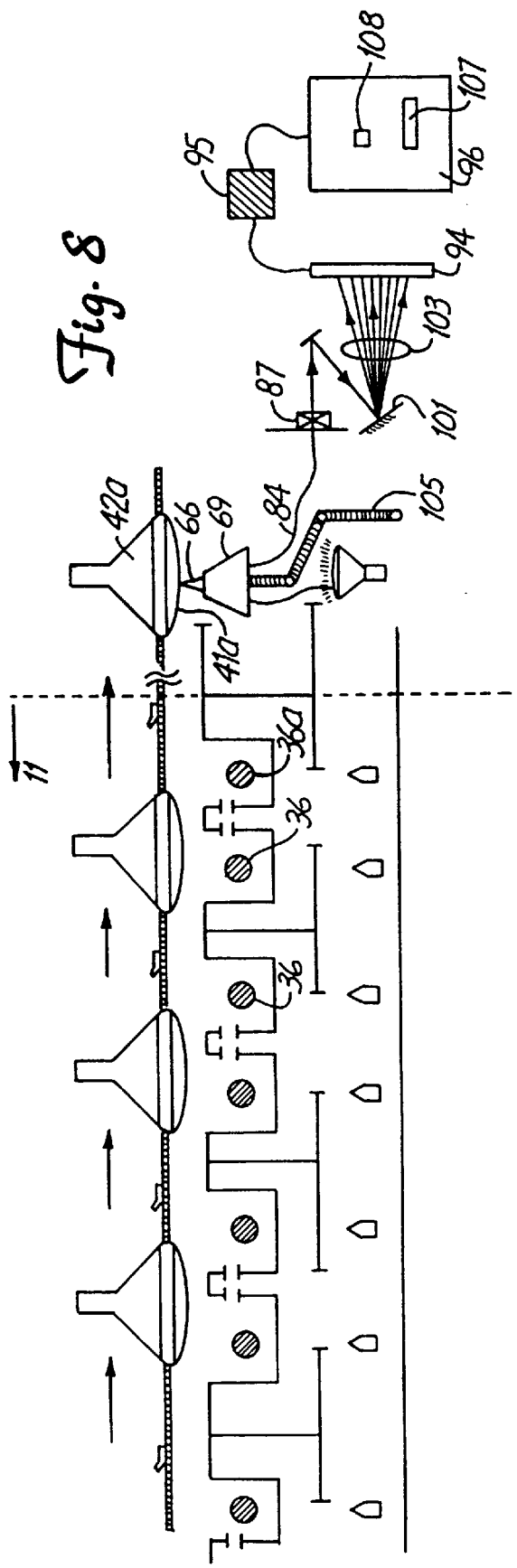
FIG. 8 is a top schematic illustration of a coating and evaluation system in one embodiment of the present invention.

FIG. 8 shows how the reflectometer/sensor combination 69 might be used in connection with the thin film deposition system of FIGS. 1 and 2. The line of CRTs moves in front of each of the cathodes 36 in turn so that after each CRT passes all of the cathodes 36, the CRTs move in front of the reflectometer/sensor combination 69. Typically, the CRTs are moved at a constant rate in front of the cathode 36. However, once each CRT passes by the final cathode 36a, the exiting CRT 42a may pause when it moves in front of the combination 69 to allow time for it to be properly positioned by the robotic arm 105 in the manner described above. (The other CRTs typically continue moving at a constant rate).

For example, in FIG. 8, the CRT 42a has just emerged from the chamber 11, and is being evaluated by the combination 69. The reflected beam 66 is captured by the combination 69 and fed via fiber optic 84 through shutter 87. The light that passes through the shutter 87 is reflected off of a light splitting apparatus 101 such as a diffraction grating (i.e., a two-dimensional prism) so that the light is reflected as an array of light beams 103. The light splitter 101 causes each wavelength of light to be reflected in a different direction so that each beam within the array 103 represents a given wavelength of light.

The array of beams 103 is directed to an array of light sensors or photodiodes 94. Each photodiode within the array of photodiodes 94 is positioned so that light corresponding to a particular wavelength is incident upon a single photodiode (or a small number of photodiodes). The amount of current flowing through the photodiodes used in the present invention depends on the intensity of the light incident upon them. Thus, the intensity of the light at any given wavelength can be determined by evaluating how much current is flowing through the photodiode that is positioned to capture light at the given wavelength.

Ideally, no current flows through the photodiodes when they are not exposed to light. In practice, however, a small amount of current flows through the photodiodes even when no light is incident upon them. This leakage current is sometimes called the "dark" current, and is generally a function of temperature. When the temperature is low, the dark current is minimized. Thus, it is preferred that the array 94 be kept cool (e.g., −5° C.) by refrigeration or other means so as to minimize the dark current.

Figure 9:
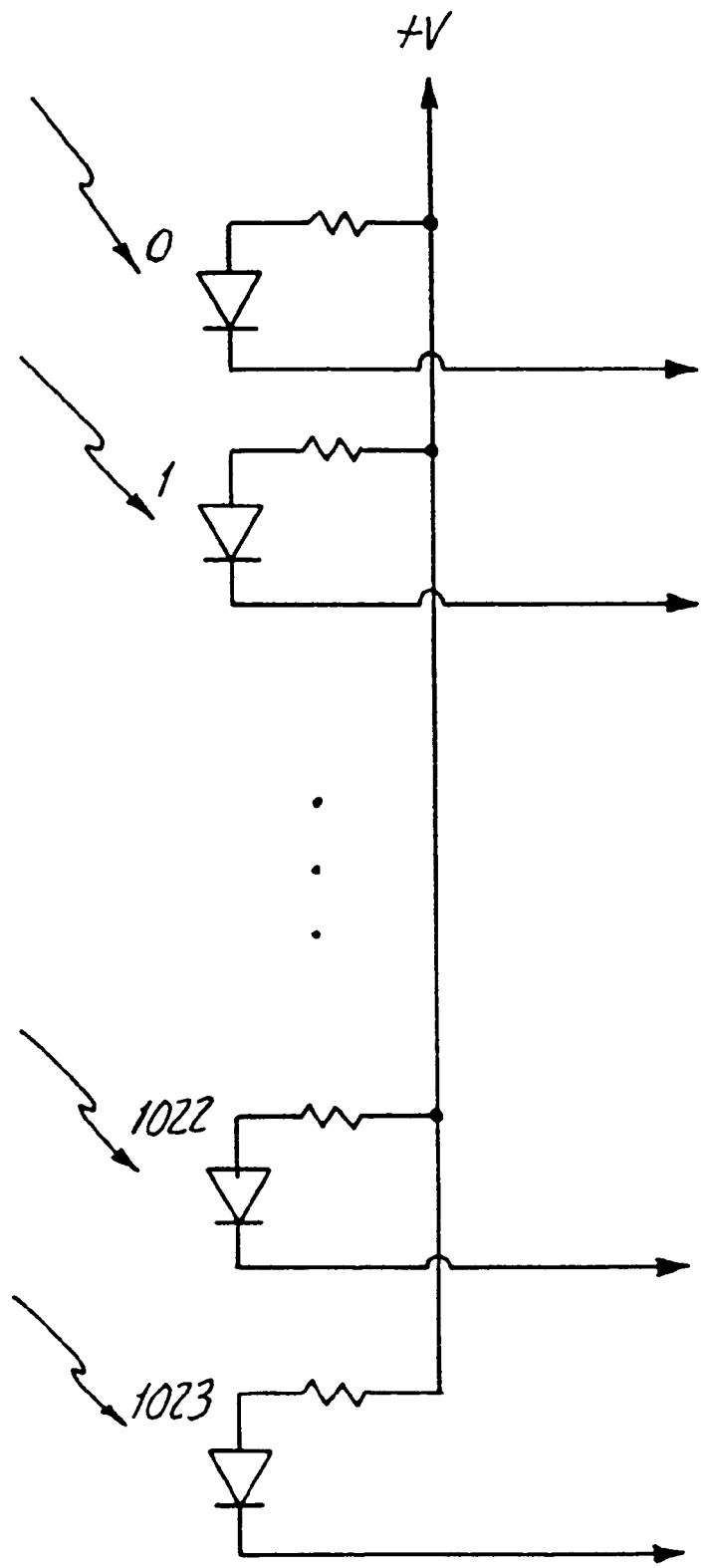
FIG. 9 is a schematic of a photoiode array.

A partial schematic of a photodiode array 94 appropriate for the present invention is shown in FIG. 9. In the embodiment shown, the array 94 has 1024 photodiodes. The amount of current flowing through each photodiodes is measured and converted into a digital code by the interface 95 (see FIG. 8). The interface 95 comprises appropriate hardware for converting the current from each of the diodes into a digital code. One or more bits can be used to represent the amount of current flowing through each of the diodes. The data is sent in digital form to a computer 96.

Figure 10A:
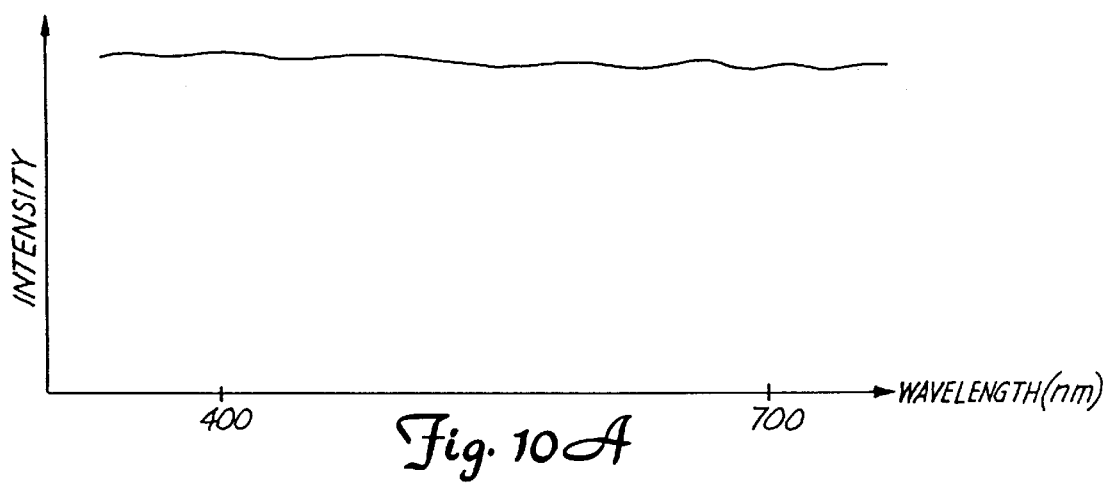
FIGS. 10a to 10c are graphs of the intensity of a reflected light beam vs. wavelength for various CRT faces.
Figure 10B:
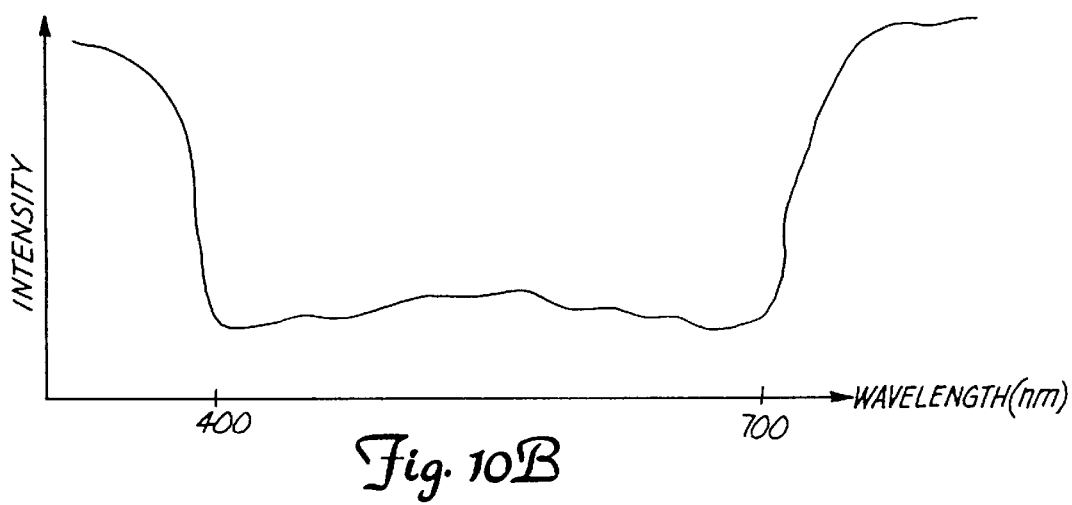
Figure 10C:
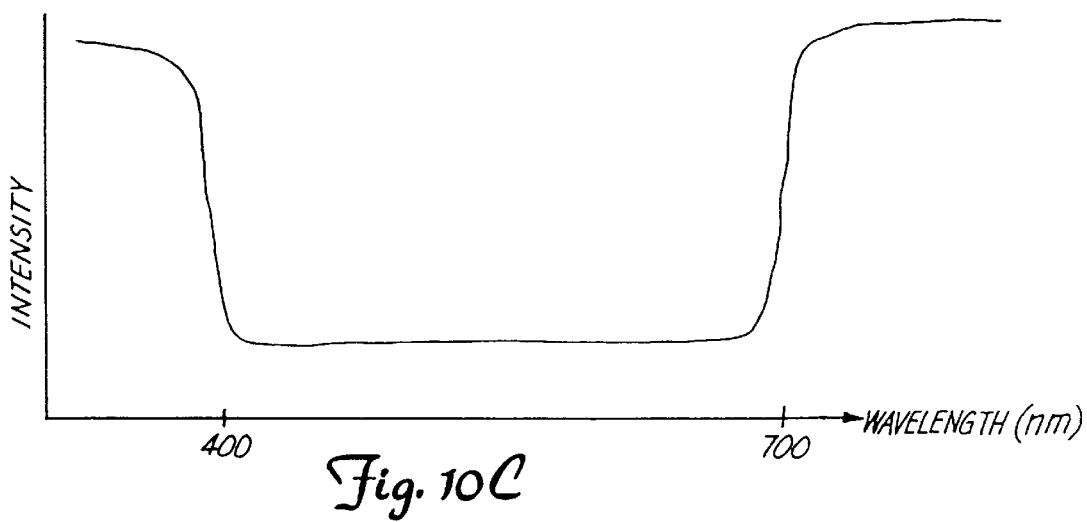

The code from the interface 95 therefore describes the intensity of the light at a given wavelength, and is sufficient for evaluating reflectance of the CRT face 41a. For a given point on a reflective CRT face, for example, a graph corresponding to intensity of the reflected light versus wavelength might look like that in FIG. 10a. For a CRT face treated with an anti-reflective coating, however, the graph might look like that in FIG. 10b. The graph of FIG. 10b differs from that in FIG. 10a because the anti-reflective coating on the face of a CRT can reduce the intensity of the reflected light beams having wavelengths between, for example, roughly 400 to 700 nm. An ideal anti-reflective coating might have an intensity versus wavelength graph that looks like the graph of FIG. 10c.

From these values of intensity, it is possible to determine the reflectance properties of the face 41 a of the CRT 42, because as is well known in the art, reflectance can be expressed as a function of the intensity. For example, for a given wavelength, the reflectance percentage can be expressed as follows:

$$\% \text{ Reflectance} = 100 \times \frac{\text{measured intensity} - \text{dark current intensity}}{\text{reference intensity} - \text{dark current intensity}} \times \text{Reflectivity of Reference,}$$

where the measured intensity is the intensity of the light reflected off of CRT face 41*a*, and where the reference intensity is the intensity of the light reflected off of a known reference material (e.g., BK-7 or any other appropriate reference material). As noted above, current flows through the photodiodes 94 even when they are not exposed to light. The "dark current intensity" represents the apparent intensity reading when no reflected light is present. Thus, the dark current intensity is factored out of the measured intensity and reference intensity values. The foregoing expression provides a result in terms of the percentage of reflectance of the reference material (e.g., BK-7 or other reference material).

In another aspect of the present invention, the accuracy or quality of a coating process can be evaluated by comparing the ideal thickness values of each of the layers with the actual thickness of each of the layers were applied to the CRT. The actual thickness can be determined by reverse engineering the coating applied to the CRT. To reverse engineer the coating, the reflectance values for each wavelength as well as the materials that are used for the layers in the coating must be known. The reflectance values for the wavelength of interest are known because they are calculated using the procedure described above in connection with FIGS. 8 and 9. Also, the materials used for each of the layers are known because the composition of the cathodes 36 is dictated by the design. Thus, it is possible to determine the actual thickness for each of the layers on the CRTs emerging from the chamber 11.

The process of determining the actual thickness of each of the layers can be carried out in a number of ways. One way is to program the computer 96 to iterate through a number of different sets of hypothetical thickness values using the properties of the layers (the properties of the layers are known). For each set, the reflectance values for the wavelengths of interest are calculated, and a reflectance vs. wavelength curve is generated for each set. The reflectance values can be calculated in the manner described in Chapter 4 of O. S. Heavens, *Optical Properties of Thin Solid Films,* which is hereby incorporated by reference.

The curve of each set of hypothetical thickness values is compared to the curve representing the values measured by the system of FIG. 8. A "merit" function is used to determine how well these two curves match—one appropriate "merit" function could involve summing the squares of the differences at each wavelength between the calculated curve and the actual curve. After the computer 96 iterates through a sufficient number of sets of thickness values, the calculated reflectance curve that most closely matches (i.e., based on the merit function) the actual reflectance curve is identified. The thickness values corresponding to the identified curve are taken to be the actual thickness values for each of the materials.

The foregoing type of calculation is carried out by commercial thin film design software such as TFCalc™ version 2.7 available from Software Spectra, Inc. of Portland, Oregon. Included with this software is a user manual describing the software; this user manual is hereby incorporated by reference. TFCalc™ or similar software can be used by the computer 96 to determine the thickness of each of the layers applied during the deposition process. Alternatively, a program carrying out the procedure set forth above (or any other appropriate procedure) can be designed to calculate the actual thickness values.

To illustrate the evaluation process and the means for analyzing the code from the interface 95, an example using a hypothetical set of data is set forth below. As described above (or using TFCalc™) it is possible to determine the actual layer thickness value for each of the layers of the coating material from (1) the reflectance values (i.e., the code), and (2) information about the composition of the layers of the coating material. Similarly, the optimal layer thickness values are known because these values correspond to the theoretical predetermined design (i.e., the thickness that theoretically provide the optimal anti-reflective effect for the composition of the coating material applied during the deposition process). The hypothetical set of data is set forth below:

| Layer | #1 | #2 | #3 | #4 | #5 | #6 | #7 |
| --- | --- | --- | --- | --- | --- | --- | --- |
| actual thickness | 21 | 18 | 15 | 16 | 18 | 13 | 15 |
| optimum (design) | 20 | 21 | 15 | 19 | 18 | 13 | 15 |

The table above indicates that in our hypothetical example, the actual measured thickness values do not correspond to the optimum values for the seven deposition materials. Specifically, layer 1 is one unit thicker than optimal, and layer 2 and 4 are three units too thin. From a quality-assurance perspective, these variances may be significant because variances from the design optimum may adversely affect the anti-reflective properties of the coating. Thus, the foregoing analysis allows those CRTs that are not within acceptable thickness tolerances to be removed from the CRT assembly line.

Figure 11:
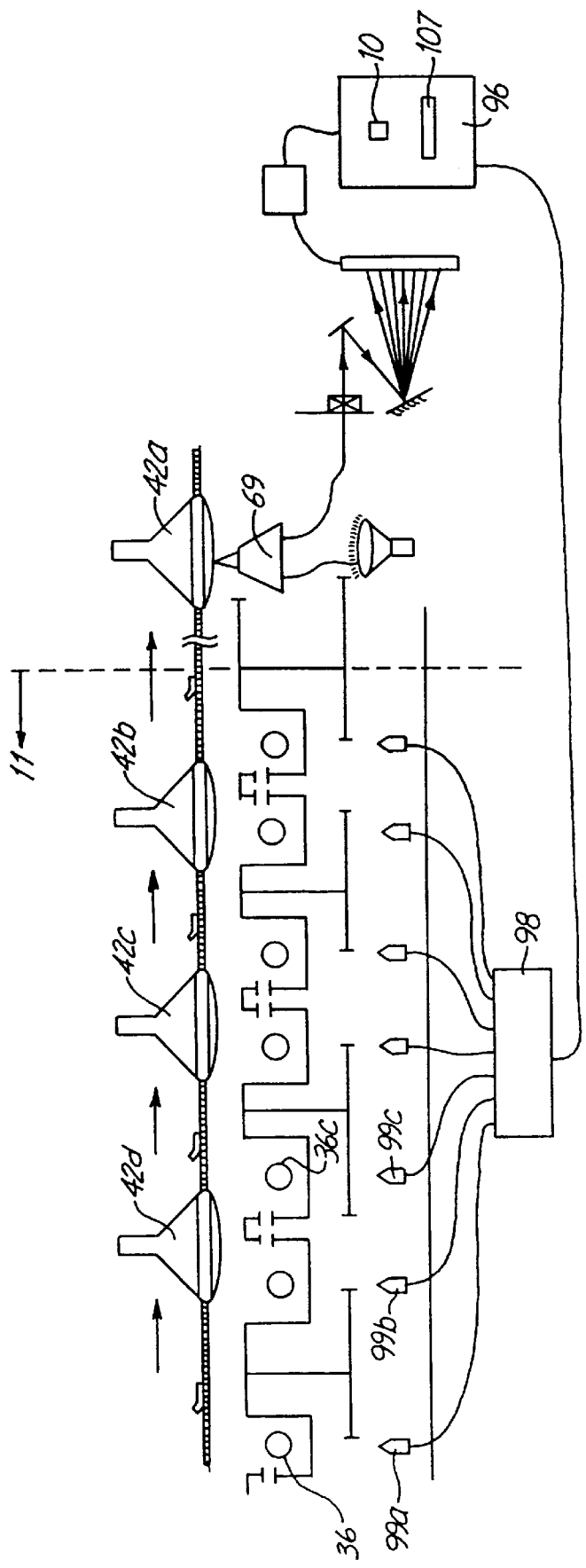
FIG. 11 is a top schematic illustration of a coating and evaluation system in another embodiment of the present invention.

In the manner described above, the data gathered by the reflectometer 51 of FIG. 8 is used to determine the quality of the reflectance coating of a CRT 41*a* emerging from the chamber 11. But this data can also be used to improve the quality of the anti-reflective coating and subsequently-treated CRTs. In other words, information about differences between actual and optimum thickness levels can be monitored, and an attempt can be made, based on this information, to correct the identified problems for subsequently-treated CRTs. FIG. 11 is a diagram of the feedback system having a control system that comprises deposition rate controllers 99 (i.e., 99*a*, 99*b*, 99*6*—one of each of the cathodes 36) and an interface 98. The rate at which each of the cathodes 36 deposits a thin film coating on the CRTs depends on the setting of the corresponding deposition rate controller 99. The computer 96 in the system of FIG. 11 analyzes the calculated thickness values of each of the layers and compares these values to the optimal values. Because in the example above the actual thickness value for layer 1 is one unit thicker than optimal, the computer 96 in such a situation would communicate through interface 98 a feedback command to the particular deposition rate controller that is responsible for layer 1. The feedback command causes the appropriate deposition rate controller to reduce the deposition rate slightly. Similarly, since the thickness of layers 2 and 4 are three units less than optimal, the computer 96 communicates a feedback command to the two deposition rate controllers responsible for layers 2 and 4 so that the deposition rate is increased for the corresponding cathodes 36. In this manner, the system of FIG. 11 fine-tunes the deposition rate for each of the deposition rate controllers 99 in an attempt to optimize the quality of the anti-reflective coating for subsequently processed CRTs.

Because the deposition rate modifications affect only those CRTs that have yet to be processed, the effect of these deposition rate modifications typically cannot be evaluated until a CRT that is affected by these changes emerges from the chamber 11. This can mean that the effect of any particular deposition rate modification will be evaluated until on or more intervening CRTs exit the chamber. For example, in FIG. 11, if the configuration of deposition rate controller 99c (corresponding to cathode 36c) is modified when the CRT 42a to 42d are positioned as shown in FIG. 11, the effect of the change will not be seen by the combination 69 or the computer 96 until CRT 42d emerges from the chamber 11. Intervening CRTs 42b and 42c had already passed the cathod 36c before the change was made, so CRT 42 is the first CRT to be affected by the modification to deposition rate controller 99c.

However, once a CRT that has undergone the changes (e.g., CRT 42d) exits the chamber 11, the effect of the deposition rate modifications can be evaluated. The previous actual thickness values, the new actual thickness values, and the optimum thickness values might at this point look like the following:

| Layer | #1 | #2 | #3 | #4 | #5 | #6 | #7 |
| --- | --- | --- | --- | --- | --- | --- | --- |
| previous | 21 | 18 | 15 | 16 | 18 | 13 | 15 |
| new | 20 | 20 | 15 | 19 | 18 | 13 | 15 |
| optimum (design) | 20 | 21 | 15 | 19 | 18 | 13 | 15 |

The foregoing table shows that the effect of the deposition rate modification was that all of the layer thickness values are now at their optimum level with the exception of layer 2. Layer 2 is still too thin, but it is now only one unit too thin, whereas the previous thickness values showed that it was three units too thin. Thus, while the deposition rate modifications did not produce the optimal result, they nevertheless had a beneficial effect. The new values may be well within acceptable tolerances.

To attempt to correct the remaining non-optimal thickness reading, the computer 96 could communicate another feedback command to the deposition rate controller for layer 2 that causes the controller to increase slightly the deposition rate for layer 2. This process could continue so that the system of FIG. 11 is continually fine-tuning the deposition rate for the various layers in an attempt to achieve or maintain the optimal anti-reflective coating.

Figure 12:
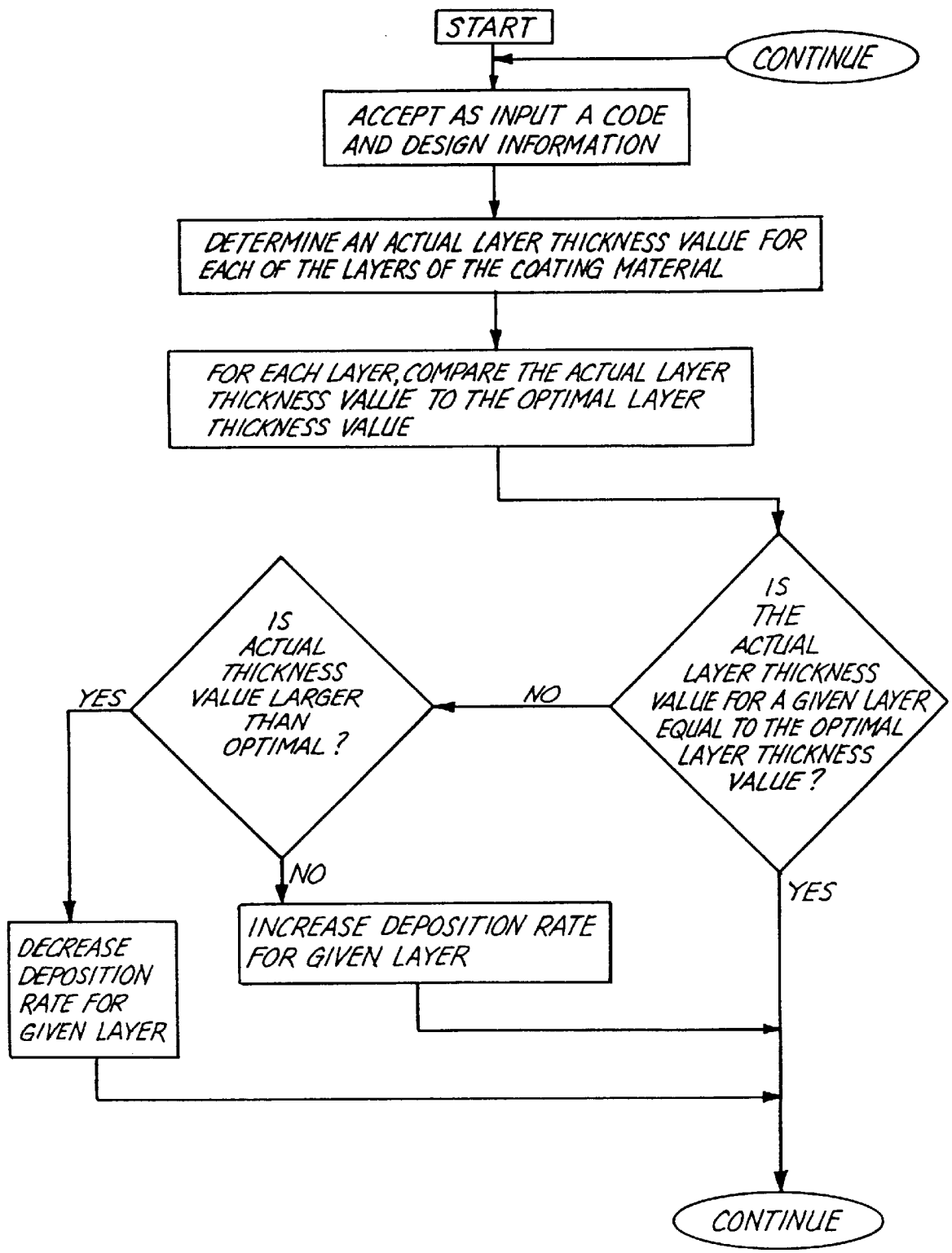
FIG. 12 is a flow chart illustrating the steps carried out by a system employing one embodiment of the present invention.

As described above, the computer 96 calculates the reflectance values and controls the deposition rate controllers 99. As is well-known in the art, the computer 96 carries out these functions under the direction of a computer program. FIG. 12 is a flow chart of steps carried out by such a program, which is stored on a data storage medium 107 shown in FIG. 11. As is well known in the art, the program is accessible and executable by one or more processors 108 in the computer 96. The data storage medium 107 could be any magnetic, optical, or hardware-based storage medium, or any other appropriate storage medium. Also, although the preferred embodiment employs a computer that executes software, the present invention contemplates a hardwired implementation.

Although the present invention has been shown and described with respect to preferred embodiments, various changes and modifications that are obvious to a person skilled in the art to which the invention pertains, even if not shown or specifically described herein, are deemed to lie within the spirit and scope of the invention and the following claims.

What is claimed is:

1. A method of evaluating reflectance of objects that are coated with a coating material, wherein the coating material has a composition comprising one or more layers, the method comprising the steps of:

capturing a light beam reflected off of a CRT, splitting the light beam into a plurality of constituent beams, each of the constituent beams being representative of a given wavelength, and each of the constituent beams being directed at a light sensor, wherein each of the light sensors generates current that varies with the intensity of the light upon each of the light sensors;

converting the current from each of the light sensors into a code that identifies the intensity of the light for each of the constituent beams;

analyzing the code along with information about the composition of the coating material to determine an actual layer thickness value for each of the layers of the coating material;

comparing the actual layer thickness value of an optimal layer thickness value, the optimal layer thickness value being calculated based on a predetermined design of the coating material; and adjusting the amount of each layer of coating material that is applied to a subsequently coated object by coating means, wherein the adjustment corrects for differences between the actual layer thickness value and the optimal layer thickness value, and wherein the adjustment is achieved by decreasing the deposition rate if the actual layer thickness value is greater than the optimal layer thickness value and increasing the deposition rate if the actual layer thickness value is less than the optimal layer thickness value.

2. A method for processing design information and a code, wherein the design information describes a composition of layers in a coating material, and wherein the code identifies light intensity at each of a plurality of frequencies, the method comprising the steps of:

analyzing the code along with information about the composition of the coating material to determine an actual layer thickness value for each of the layers of the coating material;

comparing the actual layer thickness value to an optimal layer thickness value, the optimal layer thickness value being calculated based on a predetermined design of the coating material;

increasing the thickness of a layer for a subsequently coated object if the actual layer thickness value for the layer is less than its optimal layer thickness value by increasing the rate of deposition; and decreasing the thickness of a layer for a subsequently coated object if the actual layer thickness value for the layer is more than its optimal layer thickness value by decreasing the rate of deposition.

* * * * *

UNITED STATES PATENT AND TRADEMARK OFFICE
CERTIFICATE OF CORRECTION

PATENT NO. : 6,128,087
DATED : October 3, 2000
INVENTOR(S) : William A. Meredith, Jr. et al Page 1 of 1

It is certified that error appears in the above-identified patent and that said Letters Patent is hereby corrected as shown below:

Column 3,
Line 56, reads "U.S. Patent No. 5,489,369", should read -- U.S. Patent No. 5,489,363 --

Column 6,
Line 55, reads "74, 72, 16 and 75", should read -- 74, 72 and 75 --

Column 8,
Line 65, reads "face 41 a of", should read -- face 41a of --

Signed and Sealed this

First Day of January, 2002

Attest:

Attesting Officer

JAMES E. ROGAN
Director of the United States Patent and Trademark Office